United States Patent
Zhang

(10) Patent No.: US 9,324,371 B2
(45) Date of Patent: Apr. 26, 2016

(54) SYSTEMS AND METHODS FOR MULTI-STAGE DECODING PROCESSING

(75) Inventor: Fan Zhang, Milpitas, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 136 days.

(21) Appl. No.: 13/539,639

(22) Filed: Jul. 2, 2012

(65) Prior Publication Data

US 2014/0006905 A1  Jan. 2, 2014

(51) Int. Cl.
*H03M 13/05* (2006.01)
*G11B 20/18* (2006.01)
*H03M 13/11* (2006.01)
*H03M 13/15* (2006.01)
*H03M 13/37* (2006.01)
*H03M 13/00* (2006.01)
*H03M 13/41* (2006.01)

(52) U.S. Cl.
CPC ....... *G11B 20/1833* (2013.01); *H03M 13/1157* (2013.01); *H03M 13/1171* (2013.01); *H03M 13/1515* (2013.01); *H03M 13/3707* (2013.01); *H03M 13/6331* (2013.01); *H03M 13/1102* (2013.01); *H03M 13/1105* (2013.01); *H03M 13/1191* (2013.01); *H03M 13/41* (2013.01)

(58) Field of Classification Search
CPC .. G11B 20/1833; G11B 20/185; G06F 11/08; G06F 11/10; H03M 13/03; H03M 13/1102; H03M 13/1105; H03M 13/1157
USPC .......... 714/758, 752, 763, 773, 774, E11.032, 714/E11.034, E11.035
See application file for complete search history.

(56) References Cited

U.S. PATENT DOCUMENTS

| | | | | |
|---|---|---|---|---|
| 6,901,549 | B2 * | 5/2005 | March et al. | 714/758 |
| 7,178,085 | B2 * | 2/2007 | Chae et al. | 714/758 |
| 7,568,000 | B2 * | 7/2009 | Keyes et al. | 709/200 |
| 8,196,010 | B1 * | 6/2012 | Gunnam et al. | 714/758 |
| 8,296,637 | B1 * | 10/2012 | Varnica et al. | 714/794 |
| 8,525,707 | B1 * | 9/2013 | Zhang et al. | 341/94 |
| 8,527,858 | B2 * | 9/2013 | Zhang et al. | 714/807 |
| 8,650,457 | B1 * | 2/2014 | Yeo | H03M 13/1137 714/755 |
| 2005/0132393 | A1 * | 6/2005 | Omori et al. | 720/669 |
| 2006/0265634 | A1 * | 11/2006 | Silvus et al. | 714/784 |
| 2009/0027239 | A1 * | 1/2009 | Coene | 341/50 |
| 2010/0269023 | A1 * | 10/2010 | Yang et al. | 714/769 |
| 2010/0275096 | A1 * | 10/2010 | Zhong et al. | 714/758 |
| 2011/0252283 | A1 * | 10/2011 | Mokhlesi et al. | 714/719 |
| 2013/0112752 | A1 * | 5/2013 | Negro et al. | 235/472.01 |

OTHER PUBLICATIONS

Naessens, F.; Bourdoux, A.; Dejonghe, A., "A flexible ASIP decoder for combined binary and non-binary LDPC codes," in Communications and Vehicular Technology in the Benelux (SCVT), 2010 17th IEEE Symposium on , vol., No., pp. 1-5, Nov. 24-25, 2010.*

(Continued)

*Primary Examiner* — Sam Rizk
*Assistant Examiner* — Christian Dorman

(57) ABSTRACT

The present invention is related to systems and methods for serial application of different decode algorithms to a processing data set. In some cases, a first data decode algorithm may be applied to a first detected output, and a second data decode algorithm may be applied to a second detected output. In such a case, the second detected output may be generated based at least in part on the result of applying the first data decode algorithm.

25 Claims, 3 Drawing Sheets

(56) References Cited

OTHER PUBLICATIONS

Zhao, "Joint Detection/Decoding Algorithms for Nonbinary LDPC Codes over ISI Channels" [online] [ret. on Nov. 9, 2012] Ret. From Internet: http://arxiv.org/abs/1209.2542v1.

Declercq, "Decoding Algorithms for Nonbinary LDPC Codes over GF(q)", IEEE Trans. on Commun., vol. 55(4), pp. 633-643 (Apr. 2007).

U.S. Appl. No. 13/167,764, Unpublished, filed Jun. 24, 2011 (Zongwang Li).

U.S. Appl. No. 13/316,758, Unpublished, filed Dec. 12, 2011 (Zongwang Li).

U.S. Appl. No. 13/445,834, Unpublished, filed Apr. 12, 2012 (Chung-Li Wang).

U.S. Appl. No. 13/251,340, Unpublished, filed Oct. 3, 2011 (Haitao Xia).

U.S. Appl. No. 13/284,826, Unpublished, filed Oct. 28, 2011 (Weijun Tan).

U.S. Appl. No. 13/274,443, Unpublished, filed Oct. 17, 2011 (Chung-Li Wang).

U.S. Appl. No. 13/227,538, Unpublished, filed Sep. 8, 2011 (Shaohua Yang).

U.S. Appl. No. 13/180,495, Unpublished, filed Jul. 11, 2011 (Chung-Li Wang).

Wymeersch et al., "Log-Domain Decoding of LDPC Codes Over GF(q)", IEEE Int. Conf. on Commun., vol. 2, pp. 772-776 (Jun. 2004).

\* cited by examiner

SYSTEMS AND METHODS FOR MULTI-STAGE DECODING PROCESSING

BACKGROUND OF THE INVENTION

The present invention is related to systems and methods for performing data processing, and more specifically to systems and methods for applying two or more data decode algorithms to a processing data set.

Data processing circuits often include a data detector circuit and a data decoder circuit. In some cases many passes are made through both the data detector circuit and the data decoder circuit in an attempt to recover originally written data. Each pass through both data detector circuit and the data decoder circuit may include a number of iterations through the data decoder circuit. In some cases, a default processing through the data decoder and data detector circuits may not yield a correct result.

Hence, for at least the aforementioned reasons, there exists a need in the art for advanced systems and methods for data processing.

BRIEF SUMMARY OF THE INVENTION

The present invention is related to systems and methods for performing data processing, and more specifically to systems and methods for applying two or more data decode algorithms to a processing data set.

Various embodiments of the present invention provide data processing systems. Such data processing systems include a data detector circuit and a data decoder circuit. The detector circuit is operable to apply a data detection algorithm to a data input to yield a first detected output, and to apply the data detection algorithm to the data input guided by a first decoded output to yield a second detected output. The data decoder circuit is operable to: apply a first data decoding algorithm to the first detected output to yield the first decoded output; and to apply a second data decoding algorithm to the second detected output to yield a second decoded output. In some cases, the data detector circuit may be a Viterbi algorithm data detector circuit, or a maximum a posteriori data detector circuit. In various cases, the data processing system may be implemented as part of a storage device or a receiving device. In some cases, the data processing system is implemented as part of an integrated circuit.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phases do not necessarily refer to the same embodiment. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

Figure 1:
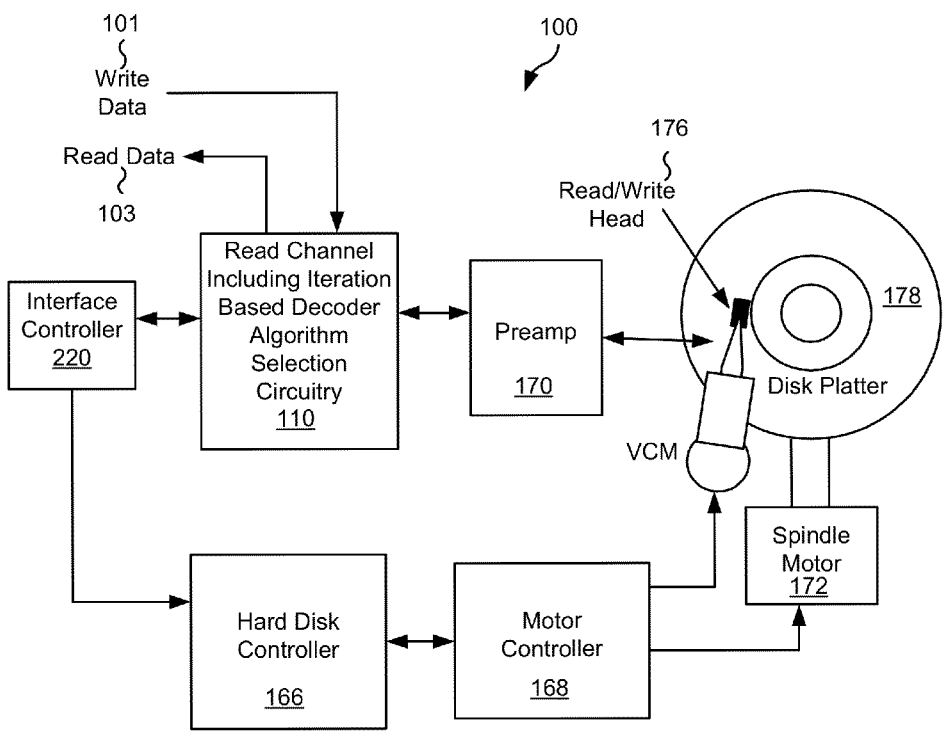
FIG. 1 shows a storage device including a read channel having iteration based decoder algorithm selection circuitry in accordance with one or more embodiments of the present invention.

The present invention is related to systems and methods for performing data processing, and more specifically to systems and methods for applying two or more data decode algorithms to a processing data set.

Various embodiments of the present invention provide for using one data decoding algorithm during a first period of processing, followed by using a second data decoding algorithm during a second period of processing. Such an approach allows for obtaining the advantages of both types data decoding algorithm. In one particular embodiment of the present invention, data processing includes applying a data detection algorithm to a data set to yield a detected output. Subsequently, a data decoding algorithm is applied to the detected output to yield a decoded output. Processing through both the data detection algorithm and the data decoding algorithm is referred to as a "global iteration". In some cases, the data decoding algorithm is re-applied multiple times during a given global iteration. Each application of the data decoding algorithm is referred to as a "local iteration". An input data set may be processed through a number of global iterations which each includes one or more local iterations before the data set converges (i.e., results in all errors being corrected) or a failure to converge is indicated. In the particular embodiment, one data decoding algorithm is applied during a first number of global iterations and another data decoding algorithm is applied during subsequent global iterations. In one particular case, the data decoding algorithm applied during the first number of global iterations is a non-binary data decoding algorithm, and the data decoding algorithm applied during the subsequent global iterations is a binary data decoding algorithm. In some cases, the first number is half of the allowable global iterations. In one particular case, the allowable number of global iterations is ten. Based upon the disclosure provided herein, one of ordinary skill in the art will recognize a variety of numbers that may be used for the first number in accordance with different embodiments of the present invention. In various cases, the first number is user programmable. In another particular case, the data decoding algorithm applied during the first number of global iterations is a binary data decoding algorithm, and the data decoding algorithm applied during the subsequent global iterations is a non-binary data decoding algorithm.

In some instances of the aforementioned embodiments, the first data decoding algorithm is a binary low density parity check data decoding algorithm, and the second the data decoding algorithm is a non-binary low density parity check data decoding algorithm. In some such cases, applying the non-binary data decode algorithm utilizes a non-binary H-matrix, and applying the binary data decode algorithm utilizes a binary H-matrix. In other instances of the aforementioned embodiments, the first data decoding algorithm is a non-binary low density parity check data decoding algorithm, and the second the data decoding algorithm is a binary low density parity check data decoding algorithm. In some such cases, applying the non-binary data decode algorithm utilizes a non-binary H-matrix, and applying the binary data decode algorithm utilizes a binary H-matrix.

In various instances of the aforementioned embodiments, the data processing system further includes a controller circuit. The controller circuit is operable to select application of the first data decoding algorithm for an initial number of global iterations, and to select application of the second data decoding algorithm for a subsequent number of global iterations. The subsequent number of global iterations occur after the initial number of global iterations. In some cases, application of the data detection algorithm to the data input is allowed to occur for a maximum number of global iterations. In some such cases, the initial number of global iterations is one half of the maximum number of global iterations. In other such cases, the initial number of global iterations is less than half of the maximum number of global iterations. In yet other such cases, the initial number of global iterations is less than the maximum number of global iterations.

Other embodiments of the present invention provide methods that include: applying a data detection algorithm to a data input to yield a first detected output; applying a first data decoding algorithm to the first detected output to yield a first decoded output; re-applying the data detection algorithm to the data input guided by the first decoded output to yield a second detected output; determining that a number of applications of the data detection algorithm to the data input is greater than a threshold; and based at least in part on the determination that the number of applications of the data detection algorithm to the data input is greater than the threshold, applying a second data decoding algorithm to the second detected output to yield a second decoded output.

In some instances of the aforementioned embodiments, the first data decoding algorithm is a binary low density parity check data decoding algorithm, and the second the data decoding algorithm is a non-binary low density parity check data decoding algorithm. In other instances of the aforementioned embodiments, the first data decoding algorithm is a non-binary low density parity check data decoding algorithm, and the second the data decoding algorithm is a binary low density parity check data decoding algorithm. In some cases, the threshold is programmable. In various cases, application of the data detection algorithm to the data input is allowed to occur for a maximum number of global iterations, and the threshold is one half of the maximum number of global iterations.

Turning to FIG. 1, a storage system 100 including a read channel circuit 110 having iteration based decoder algorithm selection circuitry is shown in accordance with some embodiments of the present invention. Storage system 100 may be, for example, a hard disk drive. Storage system 100 also includes a preamplifier 170, an interface controller 120, a hard disk controller 166, a motor controller 168, a spindle motor 172, a disk platter 178, and a read/write head assembly 176. Interface controller 120 controls addressing and timing of data to/from disk platter 178. The data on disk platter 178 consists of groups of magnetic signals that may be detected by read/write head assembly 176 when the assembly is properly positioned over disk platter 178. In one embodiment, disk platter 178 includes magnetic signals recorded in accordance with either a longitudinal or a perpendicular recording scheme.

In a typical read operation, read/write head assembly 176 is accurately positioned by motor controller 168 over a desired data track on disk platter 178. Motor controller 168 both positions read/write head assembly 176 in relation to disk platter 178 and drives spindle motor 172 by moving read/write head assembly to the proper data track on disk platter 178 under the direction of hard disk controller 166. Spindle motor 172 spins disk platter 178 at a determined spin rate (RPMs). Once read/write head assembly 178 is positioned adjacent the proper data track, magnetic signals representing data on disk platter 178 are sensed by read/write head assembly 176 as disk platter 178 is rotated by spindle motor 172. The sensed magnetic signals are provided as a continuous, minute analog signal representative of the magnetic data on disk platter 178. This minute analog signal is transferred from read/write head assembly 176 to read channel circuit 110 via preamplifier 170. Preamplifier 170 is operable to amplify the minute analog signals accessed from disk platter 178. In turn, read channel circuit 110 decodes and digitizes the received analog signal to recreate the information originally written to disk platter 178. This data is provided as read data 103 to a receiving circuit. A write operation is substantially the opposite of the preceding read operation with write data 101 being provided to read channel circuit 110. This data is then encoded and written to disk platter 178.

During operation, data is sensed from disk platter 178 and processed. This processing includes applying a data detection algorithm and an initial data decoding algorithm to the data set during an initial global iteration. Where it is determined that the data set failed to converge, the results of the initial global iteration are used to guide application of the data detection algorithm and the initial data decoding algorithm during a second global iteration. This process continues until either the processing converges, or until a defined number of global iterations have been applied to the data set. Where the data set fails to converge and the defined number of global iterations have been completed, the results of the last global iteration are used to guide application of the data detection algorithm and a subsequent data decoding algorithm during another global iteration. This process continues until either the processing converges, or until a timeout condition occurs. In on particular case, the initial data decoding algorithm is a non-binary data decoding algorithm, and the subsequent data decoding algorithm is a binary data decoding algorithm. In some cases, the defined number of global iterations is half of the allowable global iterations. In various cases, the first number is user programmable. In another particular case, the data decoding algorithm applied during the first number of global iterations is a binary data decoding algorithm, and the data decoding algorithm applied during the subsequent global iterations is a non-binary data decoding algorithm. In some embodiments of the present invention, data processing circuits similar to that discussed below in relation to FIG. 3 may be used, and/or the processing may be done similar to that discussed below in relation to FIGS. 4a-4b.

It should be noted that storage system 100 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 100, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

In addition, it should be noted that storage system 100 may be modified to include solid state memory that is used to store data in addition to the storage offered by disk platter 178. This solid state memory may be used in parallel to disk platter 178 to provide additional storage. In such a case, the solid state memory receives and provides information directly to read channel circuit 110. Alternatively, the solid state memory may be used as a cache where it offers faster access time than that offered by disk platted 178. In such a case, the solid state memory may be disposed between interface controller 120 and read channel circuit 110 where it operates as a pass through to disk platter 178 when requested data is not available in the solid state memory or when the solid state memory does not have sufficient storage to hold a newly written data set. Based upon the disclosure provided herein, one of ordinary skill in the art will recognize a variety of storage systems including both disk platter 178 and a solid state memory.

A data decoder circuit used in relation to read channel circuit 110 may be, but is not limited to, a low density parity check (LDPC) decoder circuit as are known in the art. Such low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

Figure 2:
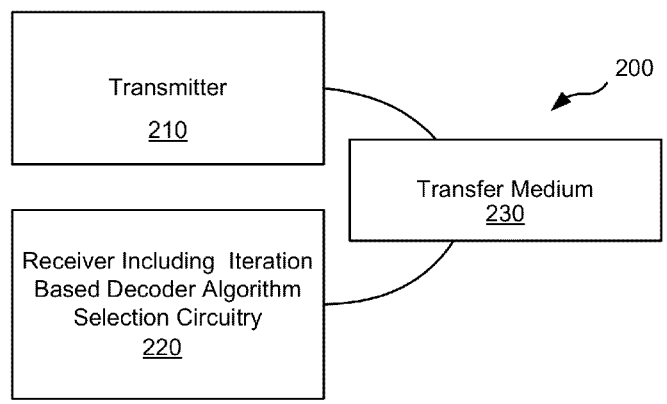
FIG. 2 shows a data transmission device including a receiver having iteration based decoder algorithm selection circuitry in accordance with some embodiments of the present invention.

Turning to FIG. 2, a data transmission device 200 including a receiver 220 having iteration based decoder algorithm selection circuitry is shown in accordance with some embodiments of the present invention. Data transmission system 200 includes a transmitter 210 that is operable to transmit encoded information via a transfer medium 230 as is known in the art. The encoded data is received from transfer medium 230 by receiver 220.

During operation, data is received by receiver 220 via transfer medium 230 and processed. This processing includes applying a data detection algorithm and an initial data decoding algorithm to the data set during an initial global iteration. Where it is determined that the data set failed to converge, the results of the initial global iteration are used to guide application of the data detection algorithm and the initial data decoding algorithm during a second global iteration. This process continues until either the processing converges, or until a defined number of global iterations have been applied to the data set. Where the data set fails to converge and the defined number of global iterations have been completed, the results of the last global iteration are used to guide application of the data detection algorithm and a subsequent data decoding algorithm during another global iteration. This process continues until either the processing converges, or until a timeout condition occurs. In on particular case, the initial data decoding algorithm is a non-binary data decoding algorithm, and the subsequent data decoding algorithm is a binary data decoding algorithm. In some cases, the defined number of global iterations is half of the allowable global iterations. In various cases, the first number is user programmable. In another particular case, the data decoding algorithm applied during the first number of global iterations is a binary data decoding algorithm, and the data decoding algorithm applied during the subsequent global iterations is a non-binary data decoding algorithm. In some embodiments of the present invention, data processing circuits similar to that discussed below in relation to FIG. 3 may be used, and/or the processing may be done similar to that discussed below in relation to FIGS. 4a-4b.

Figure 3:
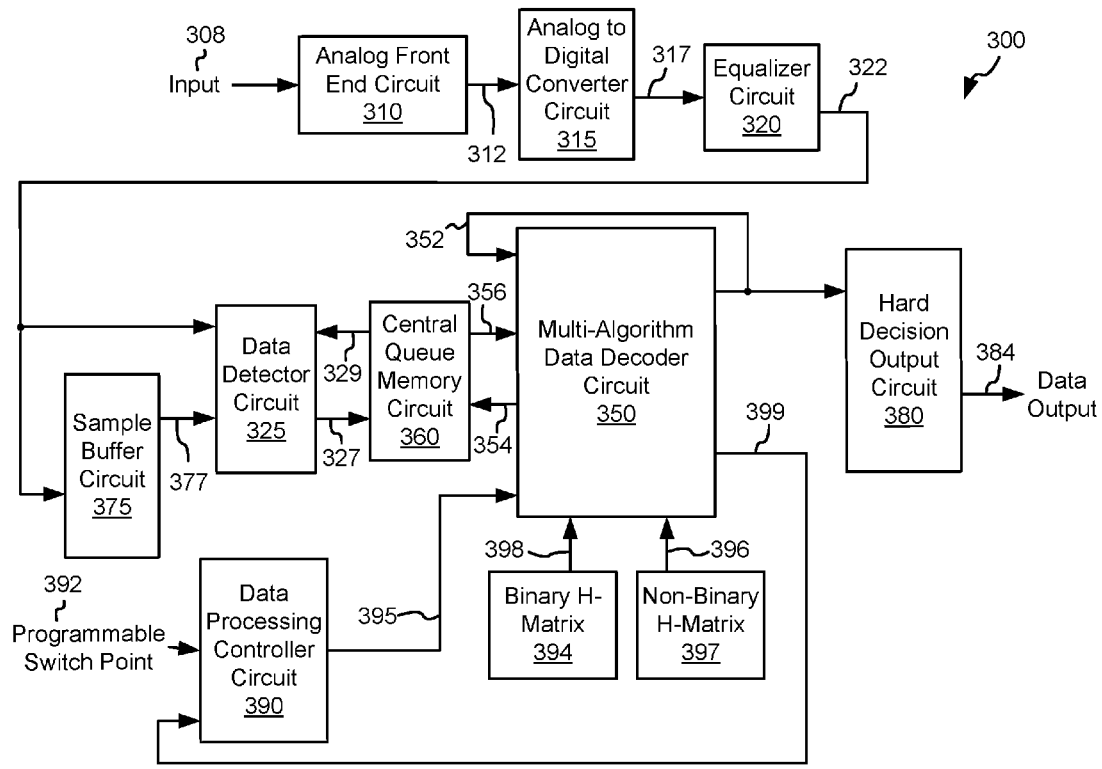
FIG. 3 depicts a data processing circuit having iteration based decoder algorithm selection circuitry in accordance with some embodiments of the present invention.

Turning to FIG. 3, a data processing circuit 300 having iteration based decoder algorithm selection circuitry is shown in accordance with some embodiments of the present invention. Data processing circuit 300 includes an analog front end circuit 310 that receives an analog input 308. Analog front end circuit 310 processes analog input 308 and provides a processed analog signal 312 to an analog to digital converter circuit 315. Analog front end circuit 310 may include, but is not limited to, an analog filter and an amplifier circuit as are known in the art. Based upon the disclosure provided herein, one of ordinary skill in the art will recognize a variety of circuitry that may be included as part of analog front end circuit 310. In some cases, analog input 308 is derived from a read/write head assembly (not shown) that is disposed in relation to a storage medium (not shown). In other cases, analog input 308 is derived from a receiver circuit (not shown) that is operable to receive a signal from a transmission medium (not shown). The transmission medium may be wired or wireless. Based upon the disclosure provided herein, one of ordinary skill in the art will recognize a variety of sources from which analog input 308 may be derived.

Analog to digital converter circuit 315 converts processed analog signal 312 into a corresponding series of digital samples 317. Analog to digital converter circuit 315 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 317 are provided to an equalizer circuit 320. Equalizer circuit 320 applies an equalization algorithm to digital samples 317 to yield an equalized output 322. In some embodiments of the present invention, equalizer circuit 320 is a digital finite impulse response filter circuit as are known in the art.

Equalized output 322 is provided to both a data detector circuit 325 and to a sample buffer circuit 375. Sample buffer circuit 375 stores equalized output 322 as buffered data 377 for use in subsequent iterations through data detector circuit 325. Data detector circuit 325 may be any data detector circuit known in the art that is capable of producing a detected output 327. As some examples, data detector circuit 325 may be, but is not limited to, a Viterbi algorithm detector circuit or a maximum a posteriori detector circuit as are known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present invention. Detected output 327 may include both hard decisions and soft decisions. The terms "hard decisions" and "soft decisions" are used in their broadest sense. In particular, "hard decisions" are outputs indicating an expected original input value (e.g., a binary '1' or '0', or a non-binary digital value), and the "soft decisions" indicate a likelihood that corresponding hard decisions are correct. Based upon the disclosure provided herein, one of ordinary skill in the art will recognize a variety of hard decisions and soft decisions that may be used in relation to different embodiments of the present invention.

Detected output 327 is provided to a central queue memory circuit 360 that operates to buffer data passed between data detector circuit 325 and data decoder circuit 350. In some cases, central queue memory circuit 360 includes interleaving (i.e., data shuffling) and de-interleaving (i.e., data un-shuffling) circuitry known in the art. When data decoder circuit 350 is available, data decoder circuit 350 accesses detected output 327 from central queue memory circuit 360 as a decoder input 356. Data decoder circuit 350 applies a data decoding algorithm to decoder input 356 in an attempt to recover originally written data. Data decoder circuit 350 is operable to initially apply a first data decoding algorithm to decoder input 356 under the direction of an algorithm selector input 395. In one particular embodiment of the present invention, the first data decoding algorithm is a non-binary data decoding algorithm applied using a non-binary H-matrix 397 providing a matrix output 396 to data decoder circuit 350. In other particular embodiments of the present invention, the first data decoding algorithm is a binary data decoding algorithm applied using a binary H-matrix 394 providing a matrix output 398 to data decoder circuit 350. Data decoder circuit 350 may be any data decoder circuit known in the art that is capable of applying a decoding algorithm to a received input. Data decoder circuit 350 may be, but is not limited to, a low density parity check (LDPC) decoder circuit or a Reed Solomon decoder circuit as are known in the art. Based upon the disclosure provided herein, one of ordinary skill in the art will recognize a variety of data decoder circuits that may be used in relation to different embodiments of the present invention.

After applying the first data decoding algorithm, a decoded output 352 is provided from data decoder circuit 350. Similar to detected output 327, decoded output 352 may include both hard decisions and soft decisions. Where the original data is recovered (i.e., the data decoding algorithm converges) or a timeout condition occurs, decoded output 352 is stored to a memory included in a hard decision output circuit 380. In turn, hard decision output circuit 380 provides the converged decoded output 352 as a data output 384 to a recipient (not shown). The recipient may be, for example, an interface circuit operable to receive processed data sets. Based upon the disclosure provided herein, one of ordinary skill in the art will recognize a variety of recipients that may be used in relation to different embodiments of the present invention. Where the original data was not recovered (i.e., the data decoding algorithm failed to converge) another local iteration through data decoder circuit 350 may be applied that is guided by decoded output 352.

Where none of the local iterations converge, another global iteration may be applied that is guided by a decoder output 354 that corresponds to decoded output 352. Data detector circuit 325 applies the data detection algorithm to buffered data 377 (i.e., the same data set) as guided by decoder output 354. Decoder output 354 is provided from central queue memory circuit 360 as a detector input 329. For the subsequent global application, it is determined by a data processing controller circuit 390 whether the data decoding algorithm will be the first data decoding algorithm or a second data decoding algorithm. Data processing controller circuit 390 determines whether a number of global iterations as incremented when a global iteration complete signal 399 is asserted by data decoder circuit 350 exceeds a programmable switch point 392. In some embodiments of the present invention, programmable switch point 392 is a fixed value. In other embodiments of the present invention, programmable switch point 392 is user programmable. In some embodiments of the present invention, programmable switch point 392 is set equal to half of the allowable number of global iterations. In one particular case, the allowable number of global iterations is ten. Based upon the disclosure provided herein, one of ordinary skill in the art will recognize a variety of numbers that may be used for the first number in accordance with different embodiments of the present invention. In one particular embodiment of the present invention, the second data decoding algorithm is a binary data decoding algorithm applied using binary H-matrix 394 providing matrix output 398 to data decoder circuit 350. In other particular embodiments of the present invention, the second data decoding algorithm is a non-binary data decoding algorithm applied using non-binary H-matrix 397 providing matrix output 396 to data decoder circuit 350.

Figure 4A:
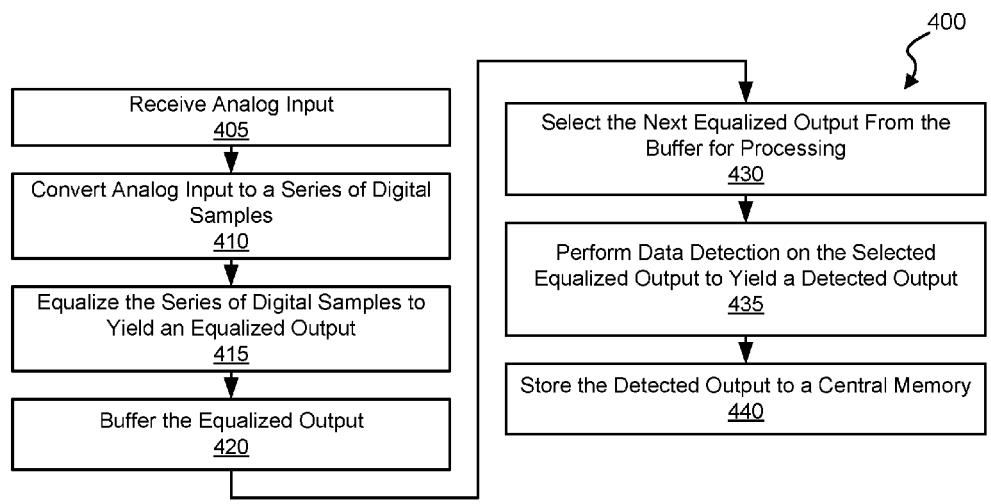
FIGS. 4a-4b are flow diagrams showing a method in accordance with some embodiments of the present invention for iteration based decoder algorithm selection.
Figure 4B:
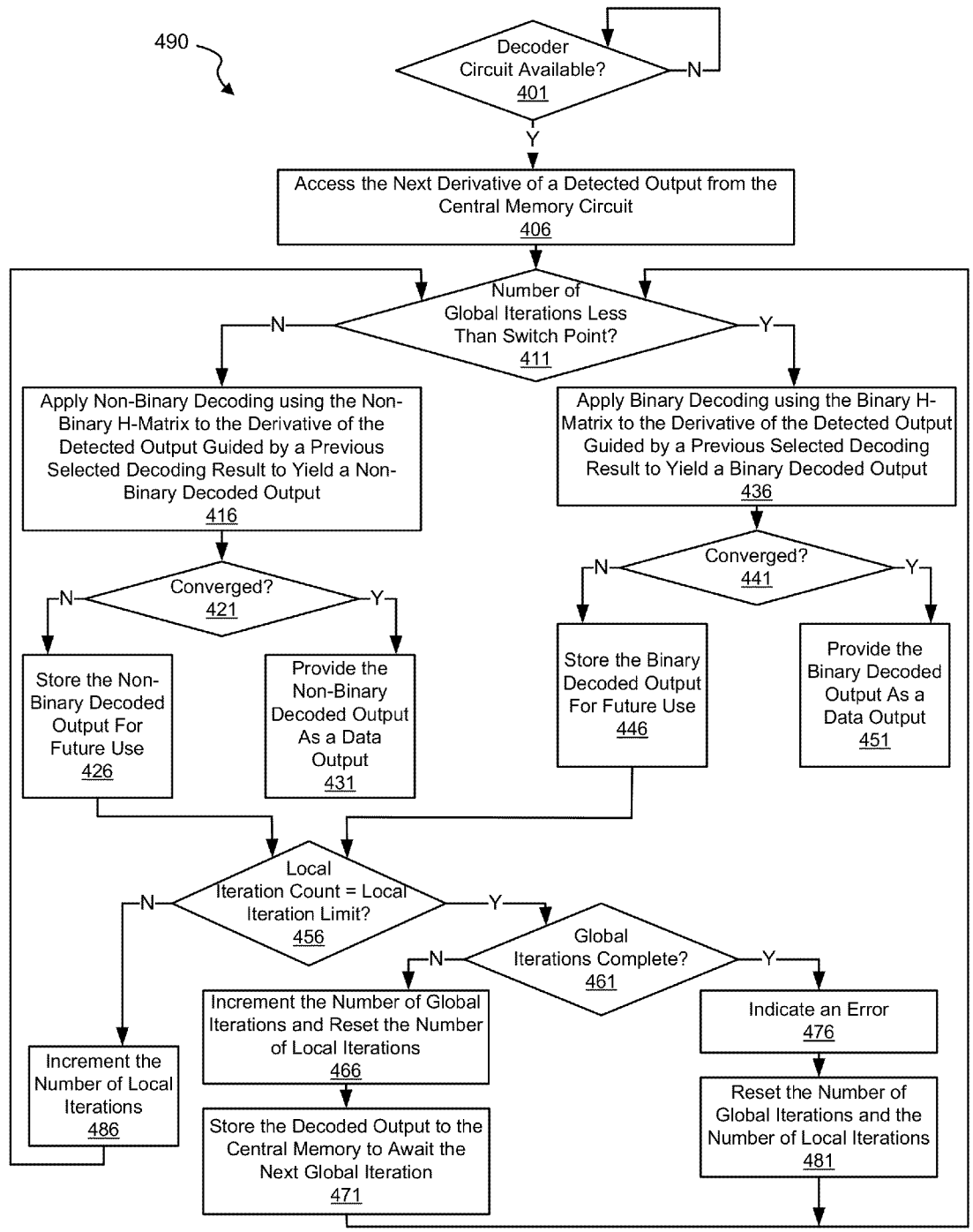

Turning to FIG. 4a-4b, flow diagrams 400, 490 show a method in accordance with some embodiments of the present invention for iteration based decoder algorithm selection. Turning to FIG. 4a and following flow diagram 400, an analog input is received (block 405). The analog input may be derived from, for example, a storage medium or a data transmission channel. Based upon the disclosure provided herein, one of ordinary skill in the art will recognize a variety of sources of the analog input. The analog input is converted to a series of digital samples (block 410). This conversion may be done using an analog to digital converter circuit or system as are known in the art. Of note, any circuit known in the art that is capable of converting an analog signal into a series of digital values representing the received analog signal may be used. The resulting digital samples are equalized to yield an equalized output (block 415). In some embodiments of the present invention, the equalization is done using a digital finite impulse response circuit as are known in the art. Based upon the disclosure provided herein, one of ordinary skill in the art will recognize a variety of equalizer circuits that may be used in place of such a digital finite impulse response circuit to perform equalization in accordance with different embodiments of the present invention. The equalized output is buffered (block 420).

The next equalized output from the buffer is selected for processing (block 430). This selection may be done in accordance with any data processing circuit selection algorithm known in the art. A data detection algorithm is applied to the selected equalized output to yield a detected output (block 435), and the detected output (or a derivative thereof) is stored to a central memory circuit (block 440). In some cases, the stored data is interleaved or shuffled. This stored data may then be accessed from the central memory for data decoding (flow diagram 490). Flow diagram 490 is discussed in relation to FIG. 4b.

Turning to FIG. 4b, flow diagram 490 shows an implementation of the aforementioned data decode processing. Following flow diagram 490, it is determined whether a decoder circuit is available to process a previously stored detected output (block 401). Where the decoder circuit is available (block 401), the next derivative of a detected output is selected for processing and accessed from the central memory circuit (block 406). It is then determined whether the number of global iterations that have already been applied to the derivative of the detected output is less than a switch point (block 411). The switch point indicates a number of global iterations at which the data decoding algorithm is switched from a first data decoding algorithm to a second data decoding algorithm. In some embodiments of the present invention, the switch point is programmable. In other embodiments of the present invention, the switch point is fixed. In one particular embodiment of the present invention, the switch point is equal to half of the allowable number of global iterations. In one particular embodiment of the present invention, the first data decoding algorithm is a non-binary LDPC data decoding algorithm, and the second data decoding algorithm is a binary LDPC data decoding algorithm. In another particular embodiment of the present invention, the first data decoding algorithm is a binary LDPC data decoding algorithm, and the second data decoding algorithm is a non-binary LDPC data decoding algorithm. The remaining portion of flow diagram 490 is described with the first data decoding algorithm being binary LDPC data decoding, and the second data decoding algorithm being non-binary LDPC data decoding, but is, of course, not the only approach covered in this application.

Where the number of global iterations is less than the switch point (block 436), a binary decoding algorithm is applied to the accessed derivative of the detected output using a binary H-matrix guided by a previous decoding result where available to yield a binary decoded output (block 436). It is determined whether the decoding process resulted in a converged output (block 441). Where the output converged (block 441), the binary decoded output is provided as a data output (block 451). In contrast, where the output failed to converge (block 441), the binary decoded output is stored for future use (block 446). This binary decoded output may be stored, for example, in a scratch register included in a data decoder circuit applying the binary data decoding algorithm.

Alternatively, where the number of global iterations is not less than the switch point (block 411), a non-binary decoding algorithm is applied to the accessed derivative of the detected output using a non-binary H-matrix guided by a previous decoding result where available to yield a non-binary decoded output (block 416). It is determined whether the decoding process resulted in a converged output (block 421). Where the output converged (block 421), the non-binary decoded output is provided as a data output (block 431). In contrast, where the output failed to converge (block 421), the non-binary decoded output is stored for future use (block 426). This non-binary decoded output may be stored, for example, in a scratch register included in a data decoder circuit applying the non-binary data decoding algorithm.

In either case, it is determined whether the number of local iterations of the data decoding algorithm applied during the current global iteration is equal to a limit (block 456). In some embodiments of the present invention, the limit is ten local iterations. Where the number of local iterations does not equal the limit (block 456), the number of local iterations is incremented (block 486) and the processes of blocks 411 through 486 are repeated for the same data set guided by the result of the previous local iteration. Alternatively, where the number of local iterations equals the limit (block 456), it is determined whether the number of global iterations are complete (block 461). In some cases, the maximum number of global iterations is ten. Where the number of global iterations is complete (block 461), an error is indicated (block 476) and the number of local iterations and the number of global iterations is reset (block 481). Alternatively, where the number of global iterations is not complete (block 461), the number of global iterations is incremented (block 466) and the decoded output is stored to the central memory to await application of the subsequent global iteration (block 471).

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system, the data processing system comprising:
    a data detector circuit operable to apply a data detection algorithm to a data input to yield a first detected output, and to apply the data detection algorithm to the data input guided by a first decoded output to yield a second detected output; and
    a data decoder circuit, wherein operation of the data decoder circuit is governed at least in part by a selected matrix input to the data decoder circuit, and wherein the data decoder circuit is operable to:
        select a respective one of a first matrix corresponding to a first data decoding algorithm or a second matrix corresponding to a second data decoding algorithm as the selected matrix to selectably apply either the first data decoding algorithm or the second data decoding algorithm to a decoder input;

receive the first detected output at the decoder input, and apply the selected first data decoding algorithm to the first detected output to yield the first decoded output; and receive the second detected output at the same decoder input, and apply the selected second data decoding algorithm to the second detected output to yield a second decoded output.

2. The data processing system of claim 1, wherein the first data decoding algorithm is a binary low density parity check data decoding algorithm, and wherein the second data decoding algorithm is a non-binary low density parity check data decoding algorithm.

3. The data processing system of claim 2, wherein applying the non-binary data decode algorithm utilizes a non-binary H-matrix, and wherein applying the binary data decode algorithm utilizes a binary H-matrix.

4. The data processing system of claim 1, wherein the first data decoding algorithm is a non-binary low density parity check data decoding algorithm, and wherein the second data decoding algorithm is a binary low density parity check data decoding algorithm.

5. The data processing system of claim 4, wherein applying the non-binary data decode algorithm utilizes a non-binary H-matrix, and wherein applying the binary data decode algorithm utilizes a binary H-matrix.

6. The data processing system of claim 1, wherein the data processing system further comprises:
a controller circuit operable to select application of the first data decoding algorithm for an initial number of global iterations, and to select application of the second data decoding algorithm for a subsequent number of global iterations, wherein the subsequent number of global iterations occur after the initial number of global iterations.

7. The data processing system of claim 6, wherein application of the data detection algorithm to the data input is allowed to occur for a maximum number of global iterations, and wherein the initial number of global iterations is one half of the maximum number of global iterations.

8. The data processing system of claim 6, wherein application of the data detection algorithm to the data input is allowed to occur for a maximum number of global iterations, and wherein the initial number of global iterations is less than half of the maximum number of global iterations.

9. The data processing system of claim 6, wherein application of the data detection algorithm to the data input is allowed to occur for a maximum number of global iterations, and wherein the initial number of global iterations is less than the maximum number of global iterations.

10. The data processing system of claim 1, wherein the data detector circuit is selected from a group consisting of: a Viterbi algorithm data detector circuit, and a maximum a posteriori data detector circuit.

11. The data processing system of claim 1, wherein the data processing system is implemented as part of a device selected from a group consisting of:
a storage device and a receiving device.

12. The data processing system of claim 1, wherein the data processing system is implemented as part of an integrated circuit.

13. The data processing system of claim 1, wherein the data processing system is implemented as part of a redundant array of inexpensive disks.

14. A method, the method comprising:
applying a data detection algorithm to a data input to yield a first detected output;

receiving the first detected output at an input of a data decoder circuit;

applying a first data decoding algorithm by the data decoder circuit to the first detected output to yield a first decoded output, wherein applying the first data decoding algorithm includes selecting a first matrix corresponding to the first data decoding algorithm to at least in part govern operation of the data decoder circuit;

re-applying the data detection algorithm to the data input guided by the first decoded output to yield a second detected output;

determining that a number of applications of the data detection algorithm to the data input is greater than a threshold;

receiving the second detected output at the same input of the data decoder circuit;

based at least in part on the determination that the number of applications of the data detection algorithm to the data input is greater than the threshold, applying a second data decoding algorithm by the data decoder circuit to the second detected output to yield a second decoded output, wherein applying the second data decoding algorithm includes selecting a second matrix corresponding to the second data decoding algorithm to at least in part govern operation of the data decoder circuit.

15. The method of claim 14, wherein the first data decoding algorithm is a binary low density parity check data decoding algorithm, and wherein the second data decoding algorithm is a non-binary low density parity check data decoding algorithm.

16. The method of claim 15, wherein applying the non-binary data decode algorithm utilizes a non-binary H-matrix, and wherein applying the binary data decode algorithm utilizes a binary H-matrix.

17. The method of claim 14, wherein the first data decoding algorithm is a non-binary low density parity check data decoding algorithm, and wherein the second data decoding algorithm is a binary low density parity check data decoding algorithm.

18. The method of claim 14, wherein the threshold is programmable.

19. The method of claim 14, wherein application of the data detection algorithm to the data input is allowed to occur for a maximum number of global iterations, and wherein the threshold is one half of the maximum number of global iterations.

20. A storage device, the storage device comprising:
a storage medium;
a head assembly disposed in relation to the storage medium and operable to provide a sensed signal corresponding to information on the storage medium;
a read channel circuit including:
an analog front end circuit operable to provide an analog signal corresponding to the sensed signal;
an analog to digital converter circuit operable to sample the analog signal to yield a series of digital samples;
an equalizer circuit operable to equalize the digital samples to yield a sample set;
a data detector circuit operable to apply a data detection algorithm to the sample set to yield a first detected output, and to apply the data detection algorithm to the sample set guided by a first decoded output to yield a second detected output; and
a data decoder circuit, wherein operation of the data decoder circuit is governed at least in part by a selected matrix input to the data decoder circuit, and wherein the data decoder circuit is operable to:

select a respective one of a first matrix corresponding to a first data decoding algorithm or a second matrix corresponding to a second data decoding algorithm as the selected matrix to selectably apply either the first data decoding algorithm or the second data decoding algorithm to a decoder input;

receive the first detected output at the decoder input, and apply the first data decoding algorithm to the first detected output to yield the first decoded output; and receive the second detected output at the decoder input, and apply the second data decoding algorithm to the second detected output to yield a second decoded output.

21. The storage device of claim 20, wherein the first data decoding algorithm is a binary low density parity check data decoding algorithm, and wherein the second data decoding algorithm is a non-binary low density parity check data decoding algorithm.

22. The storage device of claim 20, wherein the first data decoding algorithm is a non-binary low density parity check data decoding algorithm, and wherein the second data decoding algorithm is a binary low density parity check data decoding algorithm.

23. The storage device of claim 20, wherein the read channel circuit further comprises:
a controller circuit operable to select application of the first data decoding algorithm for an initial number of global iterations, and to select application of the second data decoding algorithm for a subsequent number of global iterations, wherein the subsequent number of global iterations occur after the initial number of global iterations.

24. The storage device of claim 23, wherein application of the data detection algorithm to the data input is allowed to occur for a maximum number of global iterations, and wherein the initial number of global iterations is one half of the maximum number of global iterations.

25. The storage device of claim 20, wherein the storage device further comprises:
a solid state memory device.

* * * * *